United States Patent [19]

Itoh

[11] 4,086,662
[45] Apr. 25, 1978

[54] MEMORY SYSTEM WITH READ/WRITE CONTROL LINES

[75] Inventor: Kiyoo Itoh, Higashikurume, Japan
[73] Assignee: Hitachi, Ltd., Japan
[21] Appl. No.: 713,580
[22] Filed: Aug. 11, 1976

[30] Foreign Application Priority Data

Nov. 7, 1975   Japan .................................. 50-133078
Jan. 26, 1976  Japan .................................... 51-6669

[51] Int. Cl.² .......................... G11C 7/00; G11C 11/24
[52] U.S. Cl. ..................................... 365/189; 307/238; 365/149
[58] Field of Search ...................... 340/173 R, 173 CA

[56] References Cited

U.S. PATENT DOCUMENTS

| | | | |
|---|---|---|---|
| 3,142,822 | 7/1964 | Martin | 340/173 CA |
| 3,771,147 | 11/1973 | Boll et al. | 340/173 R |
| 3,810,124 | 5/1974 | Hoffman et al. | 340/173 CA |
| 3,838,295 | 9/1974 | Lindell | 340/173 CA |
| 3,986,180 | 10/1976 | Cade | 340/173 CA |

OTHER PUBLICATIONS

*Proceedings of the S.I.D.*, vol. 11/3, Third Quarter 1970, pp. 97–104, Weiss, "Inexpensive Electronic Memories".

Primary Examiner—Stuart N. Hecker
Assistant Examiner—Donald McElheny
Attorney, Agent, or Firm—Craig & Antonelli

[57] ABSTRACT

A memory system includes a plurality of word lines arranged in parallel in a predetermined direction, a plurality of sense lines arranged in parallel to be transverse to the word lines, and memory cells located at the intersections of both the sense lines and the word lines. In addition, a control line is arranged for each of the sense lines in parallel thereto such that the selection of a given word line and a given control line enables the reading or writing of information from or to the cell located at the intersection of the selected lines.

7 Claims, 26 Drawing Figures

MEMORY SYSTEM WITH READ/WRITE CONTROL LINES

BACKGROUND OF THE INVENTION

1. Field of the Invention

The present invention relates to a construction of a destructive readout type memory system.

2. Description of the Prior Art

A semiconductor memory of the type having one transistor per cell, for example, is a destructive readout type memory system in which information stored is destroyed whenever it is read out. Therefore, heretofore, when one word line in a memory array is selected during the readout operation, information stored in all of the cells associated with the selected word line is read out on a corresponding sense line and the readout signals are sensed by high sensitivity sense amplifiers connected to the respective data lines for performing re-writing (refreshing). In this case, a rewritable sense amplifier should be provided for each of the sense lines. Such a sense amplifier occupies a much larger space than the memory cell and this makes the design of the layout of the memory array section and the sense amplifier section very difficult.

SUMMARY OF THE INVENTION

It is a primary object of the present invention to provide a memory system which enables the provision of a common sense amplifier for a plurality of sense lines, in order to resolve the inconvenience in the design of the layout.

It is another object of the present invention to provide a memory system which enables a reduction of the area occupied by the memory cells in order to obtain a high integration density.

In order to achieve the above objects, the present invention provides a memory system comprising a plurality of word lines arranged in parallel in a predetermined direction, a plurality of sense lines arranged in parallel transverse to said word lines, and memory cells located at the intersections of both lines, wherein a control line is arranged for each of the sense lines in parallel thereto such that the selection of a given word line and a given control line enables the reading or writing of information from or to the cell located at the intersection of the selected lines.

DESCRIPTION OF THE PREFERRED EMBODIMENTS

Figure 1:
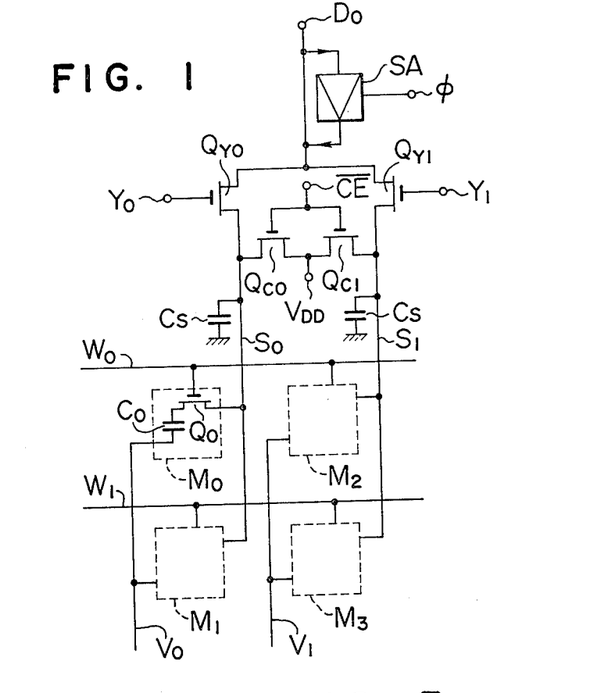
FIG. 1 shows a circuit configuration of one embodiment of a memory system of the present invention.

FIG. 1 shows a circuit diagram of one embodiment of the memory system of the present invention. In FIG. 1, $W_0$ and $W_1$ designate word lines, $S_0$ and $S_1$ designate sense lines, $M_0$ to $M_3$ represent memory cells, $V_0$ and $V_1$ designate control lines, $C_0$ and $Q_0$ denote a memory charge storing capacitor and a transistor, respectively, forming a memory cell $M_0$, $\overline{CE}$ denotes a precharging control signal receiving terminal, $V_{DD}$ designates a power supply terminal, $Q_{C0}$ and $Q_{C1}$ designate precharging transistors, $Y_0$ and $Y_1$ designate sense line switching signal terminals, $Q_{Y0}$ and $Q_{Y1}$, denote sense line switching transistors, $C_S$ denotes a sense line capacitance, SA denotes a sense amplifier, $D_0$ denotes a data input/output terminal, and $\phi$ represents a sense amplifier operating clock signal terminal.

Generally, the word lines $W_0$, $W_1$ and the sense lines $S_0$, $S_1$ are arranged to be transverse to each other and the memory cells $M_0$ to $M_3$ are arranged at the intersections of both lines. Each of the memory cells, e.g. the memory cell $M_0$, comprises the charge storing capacitor $C_0$ and the transistor $Q_0$, the gate of which is connected to the word line $W_0$, the drain of which is connected to the sense line $S_0$ and the source of which is connected to one electrode of the capacitor $C_0$. Supplied to the sense lines $S_0$ and $S_1$ is a power supply voltage from the terminal $V_{DD}$ through the transistors $Q_{C0}$ and $C_{C1}$ by a control signal from the terminal $\overline{CE}$ so that the sense lines $S_0$ and $S_1$ are precharged.

A characteristic feature of the present invention resides in that the other terminals of the capacitors $C_0$ of the cells $M_0$, $M_1$ and $M_2$, $M_3$ connected to the sense lines $S_0$ and $S_1$, respectively, are connected to the control lines $V_0$ and $V_1$, respectively, to which a control signal is selectively applied, and the sense lines $S_0$ and $S_1$ are connected to the common sense amplifier SA and the data input/output terminal $D_0$ through the switching transistors $Q_{Y0}$ and $Q_{Y1}$.

Thus, when the word line $W_0$ is selected for the applications of a high level voltage, and a low level voltage is applied to the control line $V_0$ and the high level voltage is applied to the control line $V_1$, the cell $M_2$ of the cells connected to the word line $W_0$, the control line of which is connected to the one terminal of the memory charge storing capacitor and has been previously maintained at the high level voltage, does not produce an output to the sense line $S_1$ but only the cell $M_0$, the control line of which is at the low level voltage, produces the output to the sense line $S_0$. That is, only the cell $M_0$ to which the word line $W_0$ and the voltage control line $V_0$ at the one terminal of the capacitor are selected coincidently, produces the output.

Figure 2:
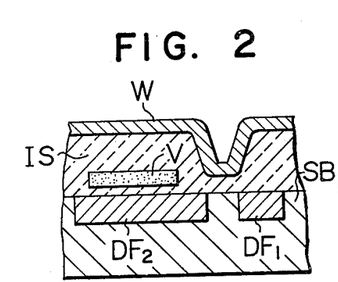
FIGS. 2 to 4 show sectional views of memory cells used in the memory system of FIG. 1.

FIG. 2 shows a sectional view of an example of the memory cell shown in FIG. 1, in which diffusion layers $DF_1$ and $DF_2$ are formed in a substrate SB, and a control line V of polysilicon and a word line W of aluminum are arranged on the substrate SB with an insulating film IS of $SiO_2$ being interposed therebetween. A storing capacitor is formed by a thin insulating film portion between the diffusion layer $DF_2$ and the control line V of polysilicon. The diffusion layer $DF_1$ corresponds to the sense line S.

Figure 3:
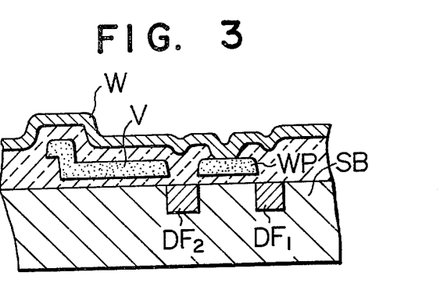
Figure 4:
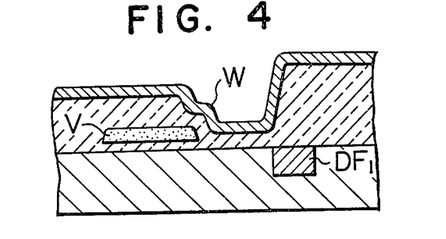

FIGS. 3 and 4 show sectional views of other examples of the memory cell. In FIG. 3, an area WP of polysilicon is formed at a portion of the word line W, that is at an area corresponding to a gate of a transistor. In FIG. 4, the diffusion layer $DF_1$ has been eliminated.

Figure 5:
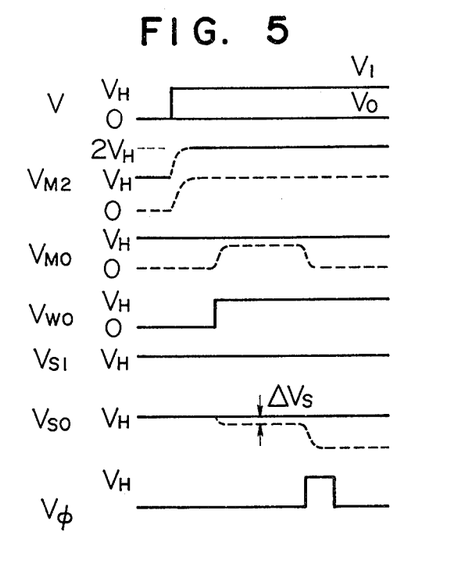
FIG. 5 shows signal waveforms at various points in FIG. 1.

FIG. 5 shows signal waveforms at various points in FIG. 1. The operation of FIG. 1 is now explained in further detail with reference to FIG. 5. The following description assumes that the memory cells are constructed as shown in FIG. 2.

When the low level voltages (0 volt) or high level voltages ($V_H$) corresponding to the stored information "1" or "0" are stored in the capacitors $C_0$ of the memory cells M, the stored voltage $V_{M2}$ of the non-selected cell $M_2$ rises approximately to $V_H$ or $2V_H$ by capacitive coupling if the voltage of the control line $V_1$ is set to the high level voltage $V_H$. Under this condition, even if the high level voltage $V_H$ is applied to the word line (see $V_{W0}$), the transistor of the cell $M_2$ is cut off since the voltage $V_{S1}$ of the sense line $S_1$ has been previously charged to $V_H$ by the power supply voltage $V_{DD}$ and hence the gate and source voltages of that transistor are substantially equal, and the voltage $V_{s1}$ of the sense line $S_1$ remains at $V_H$. Consequently, the content of the cell $M_2$ is not destroyed. On the other hand, as for the selected cell $M_0$, since the control line $V_0$ is at the low level voltage the stored voltage $V_{M0}$ is at 0 volt or $V_H$. Thus, when the voltage $V_{W0}$ of the word line $W_0$ becomes $V_H$, a differential voltage produced on the sense line $S_0$ (see $V_{S0}$) between the voltage when the stored voltage $V_{M0}$ is at 0 volt and the voltage when it is at $V_H$, is represented by;

$$\Delta V_S = [1 + (C_S/C_0)] \cdot V_H \quad (1)$$

In order to discriminate the information "1" and "0" by the above differential voltage, a gate signal is applied to the terminal $Y_0$ to turn the transistor $Q_{Y0}$ on for introducing the differential voltage to the sense amplifier SA. Since only the selected cell $M_0$ is read out destructively, the readout signal is amplified by the sense amplifier SA and an output therefrom is rewritten into the cell $M_0$ in synchronism with the clock $V_\phi$.

Figure 6:
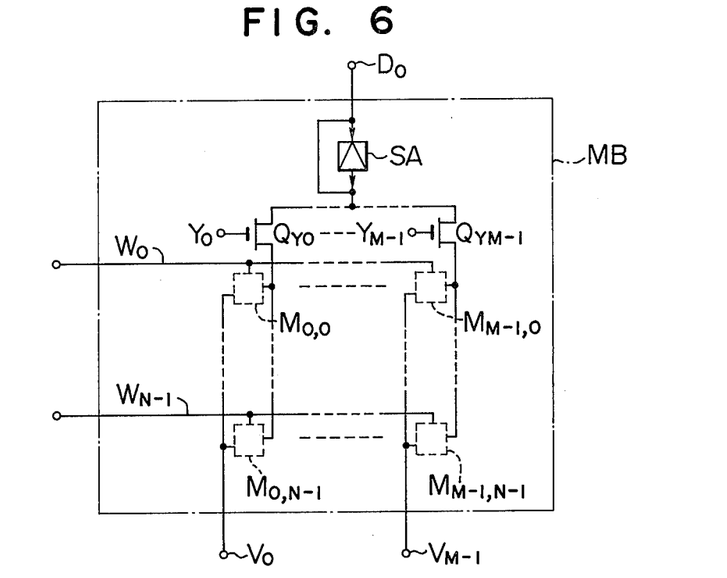
FIG. 6 shows a circuit arrangement illustrating a modification in which the memory cells of FIG. 1 are arranged in M-row by N-column matrix.

In this manner, the present invention allows the selective access of a particular cell of a plurality of cells associated with the selected word line. Consequently, it provides the following significant advantage. The differential voltage signal $\Delta V_S$ produced on the sense line during the readout operation is usually very small because of $C_S > C_0$. If $C_0$ is increased to increase $\Delta V_S$, the cell area also increases, as seen from FIG. 2, thereby preventing the realization of a high density integration. In the present invention, $C_0$ can be reduced to compare with the prior art device while enabling the high density integration. More particularly, assuming that the limit of the number of memory cells which can be connected to one sense amplifier is $n$ owing to the limitation by the sensitivity of the sense amplifier, the cells are arranged in an N by M matrix where $N \times M = n$, as shown in FIG. 6. Let assume that the sense line capacitance per bit is $C_S$ and the capacitance at a node, at which the drains of the transistors $Q_{Y0}$ to $Q_{YM-1}$ of FIG. 6 are connected in common, per bit, that is, total capacitance at the node divided by the number M of the sense lines, is equal to $C_S'$, for the sake of simplification. In the prior art device, when $n$ memory cells are connected to one sense line, the sense line capacitance $C_S$ will be equal to $nC_S'$. On the other hand, in the present invention of FIG. 6, it is equal to $(N+M)C_S'$. Since $N \times M = n$ is fixed, $C_S$ is minimum when N is equal to M and it amounts to $2NC_S'$. For example, when $n = 64$, $\Delta V_S = C_0/16C_S$ in the present invention while $\Delta V_S = C_0/64C_S$ in the prior art device, as seen from the equation (1). It is thus seen that for a given magnitude of $\Delta V_S$ to be produced, $C_0$ can be reduced to one fourth of that in the prior art device by the matrix arrangement of the present invention. The matrix arrangement enables considerable reduction in cell area or the reduction in chip size. Writing into the cells in FIGS. 1 and 6 can be selectively made to the cells whose control lines $V_0$ to $V_{M-1}$ and the word lines are selected coincidently. Namely, only the selected word line $W_0$ is set to $V_H$, and one (e.g. $V_0$) of the control lines $V_0$ to $V_{M-1}$ is set to the low level voltage and the transistor $Q_{Y0}$ is turned on so that $V_H$ or 0 volt is written into the cell $M_0$ depending on the write information externally applied to the data input/output terminal $D_0$.

In the embodiments of FIGS. 3 and 4, the channel voltage may be selected high enough to prevent the destruction of the content even when the word voltage is applied. Thus, the high level pulse voltages may be applied to the control lines $V_0$ to $V_{M-1}$. During the selection operation, writing and reading can be carried out in the same manner as described before only if a predetermined constant voltage which is sufficient to allow the formation of the channel is applied to the control line. Thus, the teaching of the present invention is commonly applicable irrespective of the particular constructions of the cells.

Figure 7:
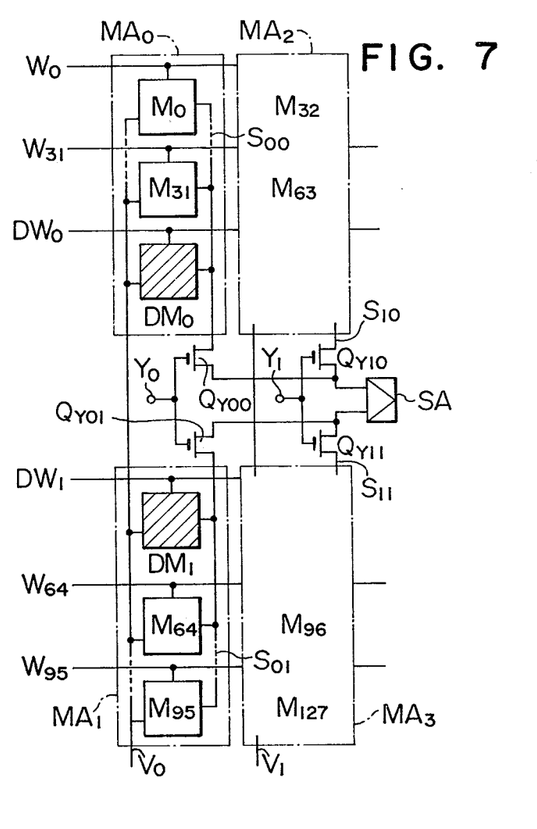
FIGS. 7 and 8 show circuit arrangements of other embodiments, respectively, of the memory system of the present invention.

FIG. 7 shows a circuit diagram of another embodiment of the memory system of the present invention, in which dummy cells are used.

As shown in FIG. 7, a memory array $MA_0$ in which a plurality of memory cells $M_0$ to $M_{31}$ and a single dummy cell $DM_0$ are connected to a common sense line $SS_{00}$ and a memory array $MA_1$ in which a plurality of memory cells $M_{64}$ to $M_{95}$ and a single dummy cell $DM_1$ are connected to a common sense line $S_{01}$, are arranged symmetrically around the sense amplifier SA, and the sense lines $S_{00}$ and $S_{01}$ are connected to the two input terminals of the sense amplifier SA through the transistors $Q_{Y00}$ and $Q_{Y01}$. Similarly, the memory arrays $MA_2$ and $MA_3$ of the like construction are arranged symmetrically and the sense lines $S_{10}$ and $S_{11}$ are connected to the same amplifier SA. With this arrangement, when the cell $M_0$ is to be selected, the word line $W_0$ and the word line $DW_1$ for the dummy cell $DM_1$ are selected. In the charge storing capacitor for the dummy cell $DM_1$, there has been stored a voltage which is intermediate the stored voltages 0 volt and $V_H$ for the memory cell $M_0$. Thus, whenever it is read out, a small differential voltage is produced on the sense lines $S_{00}$ and $S_{01}$. This voltage is sensed by the sense amplifier SA. It should be understood that the number of the memory arrays and the number of memory cells are not limited to the specific examples illustrated above.

Figure 8:
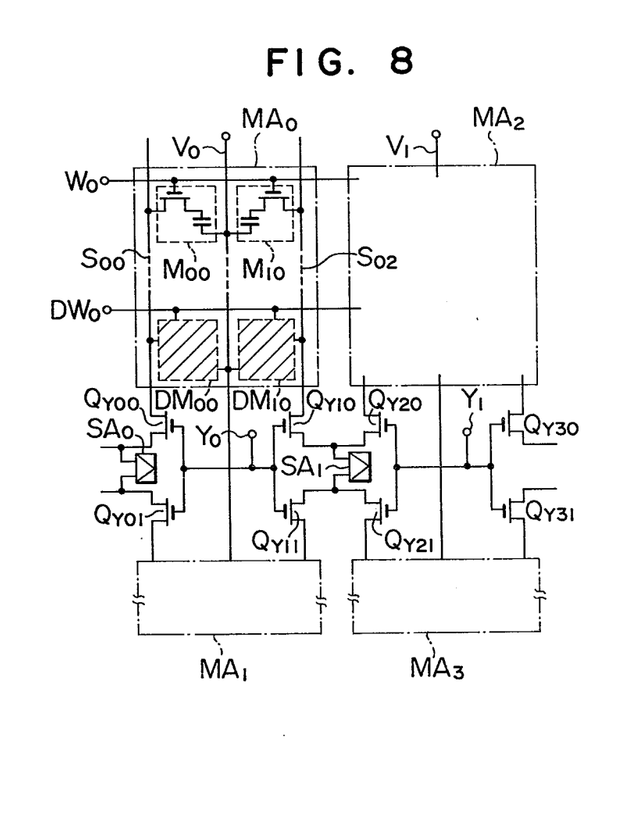

FIG. 8 shows a further embodiment of the memory system of the present invention, in which a control line is shared by memory cells connected to two sense lines in order to simplify the layout and reduce the cell area.

In each of the memory array, e.g. in the memory array $MA_0$, the control line $V_0$ is shared by the memory cells $M_{00}$ and $M_{10}$ connected to the two sense lines $S_{00}$ and $S_{02}$ and the dummy cells $DM_{00}$ and $DM_{10}$. The sense lines $S_{00}$ and $S_{02}$ are connected to the separate sense amplifiers $SA_0$ and $SA_1$. One input terminal of each of the sense amplifier, e.g., the sense amplifier $SA_1$, receives a signal on one of the sense lines of two or more memory arrays, e.g., the memory arrays $MA_0$ and $MA_2$. On the other hand, the other input terminal of the sense amplifier $SA_1$ receives a signal on one of the sense lines of the memory arrays $MA_1$ and $MA_3$.

Therefore, if the word line $W_0$ and the control line $V_0$, for example, are selected, the outputs of the cells $M_{00}$ and $M_{10}$ are applied, together with the outputs of the corresponding dummy cells in the memory array $MA_1$, to separate sense amplifiers $SA_0$ and $SA_1$.

Figure 9:
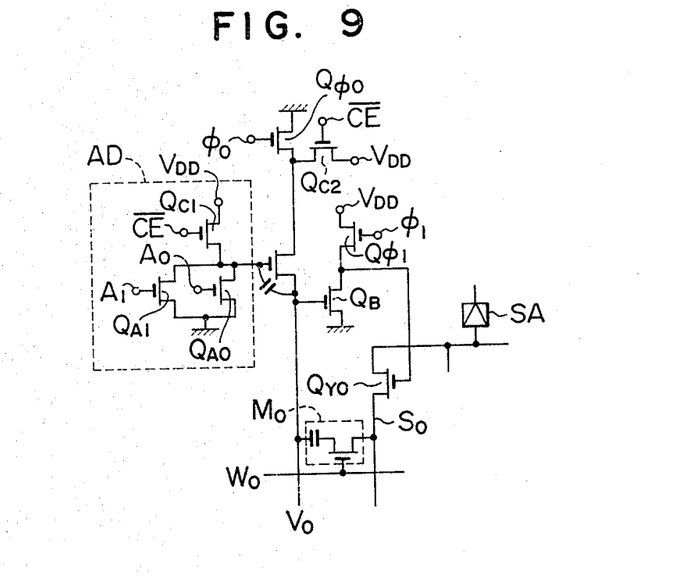
FIGS. 9 and 10 are circuit diagrams illustrating examples of driver circuits, respectively, for the memory cells of the present invention.

FIG. 9 shows an embodiment of a circuit for producing the voltage on the central line V and the gate voltage for the sense line switching transistor $Q_Y$ shown in FIGS. 1 and 6. It is shown for the control line $V_0$ and the transistor $Q_{Y0}$. In FIG. 9, AD designates an address decoder, $A_0$ and $A_1$ designate address terminals, and $\phi_0$ and $\phi_1$ designate clock terminals. During stand-by period, the transistor $Q_{C2}$ is in its on state and the control line $V_0$ is precharged to the level of $V_H$. The transistor $Q_B$ is in its on state and the gate of the transistor $Q_{Y0}$ is at the low level voltage. When an address is selected to specify an output of the decoder AD, the output of the selected decoder AD becomes the high level voltage $V_H$ and the output of the non-selected decoder AD assumes the low level voltage. Even if the transistor $Q_{\phi 0}$ is subsequently turned on, the control line voltage for the capacitor of the non-selected cell remains at $V_H$. On the other hand, for the selected cell, the control line $V_0$ assumes the low level voltage (0 volt) since the transistor $Q_{\phi 0}$ is in its on state. Thereafter, a voltage is applied to the word line $W_0$ for reading and writing. At the same time, the clock $\phi_1$ is applied to turn the transistor $Q_{\phi 1}$ on and $V_H$ is applied to the gate of the transistor $Q_{Y0}$ to turn the transistor $Q_{Y0}$ on to allow communication of data between the sense line $S_0$ and the external sense amplifier SA. Of course, the gate voltage of the non-selected transistor $Q_{Y0}$ is at the low level voltage because the voltage of the control line $V_0$ is at $V_H$, all of the transistors except the selected transistor $Q_{Y0}$ are cut off.

Figure 10:
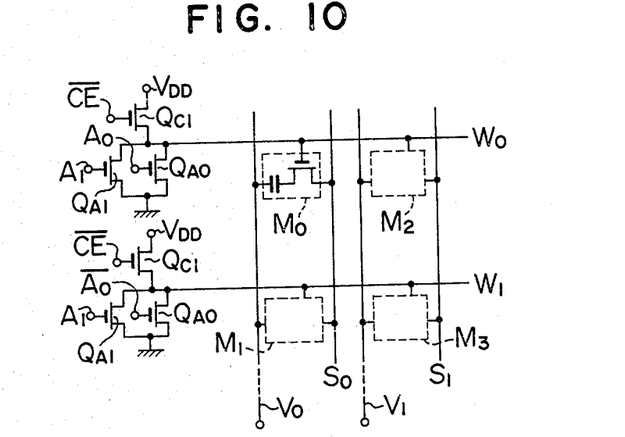

FIG. 10 shows as embodiment of a selection circuit for the word lines W shown in the previous embodiment. Like the address decoder of FIG. 9, the selection circuit comprises terminals $V_{DD}$, $\overline{CE}$, $A_1$ and $A_0$ and transistors $Q_{A0}$, $Q_{A1}$ and $Q_{C1}$. In operation, all of the word lines are initially precharged to $V_H$ during on state of the transistor $Q_{C1}$ (stand-by period). Simultaneously, the control lines $V_0$ and $V_1$ as well as all of the sense lines $S_0$ and $S_1$ are also precharged to $V_H$. Under this condition, since the transistors in all of the memory cells $M_0$ to $M_3$ are cut off, the contents stored therein are not destroyed. When a chip is then selected, the voltage of the selected word line is maintained at $V_H$ by the address signals from the terminals $A_0$ and $A_1$, and all of the non-selected word lines are discharged to the low level voltage. After the completion of this operation, only the selected one of the control lines $V_0$ and $V_1$ is discharged to the low level voltage so that only one of the cells M is selected in the same manner as described above, and the readout voltage of that cell is supplied to the sense line S.

Figure 11:
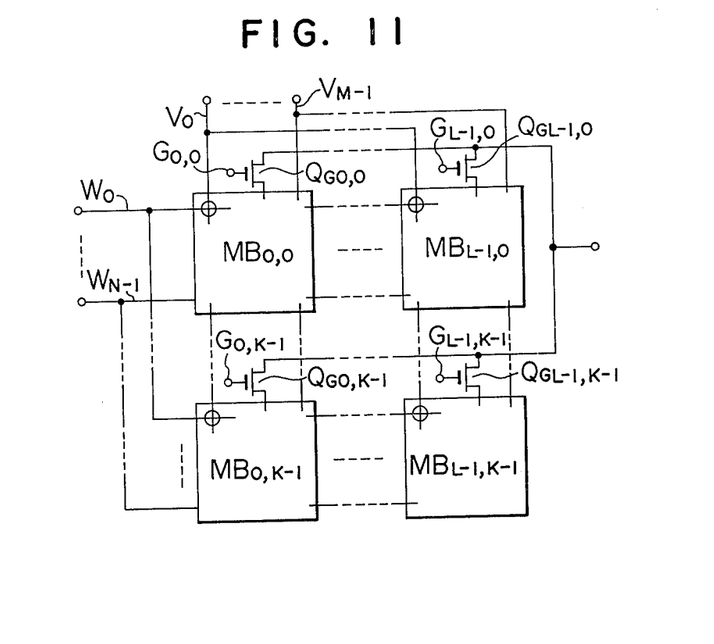
FIG. 11 is a circuit diagram illustrating a further embodiment of the memory system of the present invention.

FIG. 11 shows an embodiment in which a plurality of memory blocks MB as shown in FIG. 6 are used to realize a one-chip memory. In each of the memory blocks $MB_{0,0}$ to $MB_{L-1, K-1}$, only those one-bit cells which are located at the intersections of the control lines $V_0$ to $V_{M-1}$ and the word lines $W_0$ and $W_{N-1}$ are selected so that total of L × K bits are selected. Only one bit of those is selected by turning one of the transistors $Q_{G00}$ to $Q_{GL-1, K-1}$ on for transferring an output or receiving an input data. This system can be realized by the feature of the memory cell of the present invention that those bits whose control lines $V_0$ to $V_{M-1}$ and the word lines $W_0$ to $W_{N-1}$ are not selected coincidently are non-destructively read out. The transistors $Q_{G0,0}$ to $Q_{GL-1,K-1}$ are connected to the data input/output terminals D in the corresponding blocks. The arrangement of the memory block of the present embodiment affords the following advantages.

(1) The number of the drive circuits for the word lines and the control lines can be considerably reduced to compare with the prior art arrangement, and hence the chip size can also be reduced. For example, assuming that each of the memory blocks MB comprises 8 × 8 cells to form a 4096-bit memory with L = K = 8, conventional memory array requires 64 word line drive circuits because the memory array is arranged in a 64 × 64 matrix while the present system requires only 8 drive circuits. The same is true for the number of the drive circuits for the control lines $W_0$ to $W_{M-1}$.

(2) The layout is extremely simplified because only one sense amplifier SA in the memory block and only one signal generating circuit to the terminals $G_{0,0}$ to $G_{L-1,K-1}$ are required for each of the blocks.

(3) Since only one bit in each of the memory blocks MB is associated with the operation, the interference of signals or noises between adjacent bits, which have been encountered in the prior art system, can be completely eliminated.

The refresh of the memory system is performed simultaneously for total of L × K bits, one from each of the memory blocks MB, using the sense amplifiers in each of the memory blocks MB.

Figure 12:
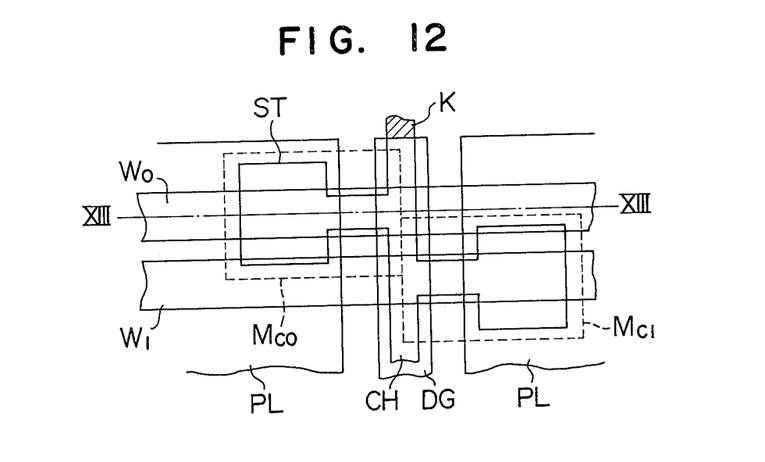
FIG. 12 shows a layout of the further embodiment of the memory system of the present invention.
Figure 13:
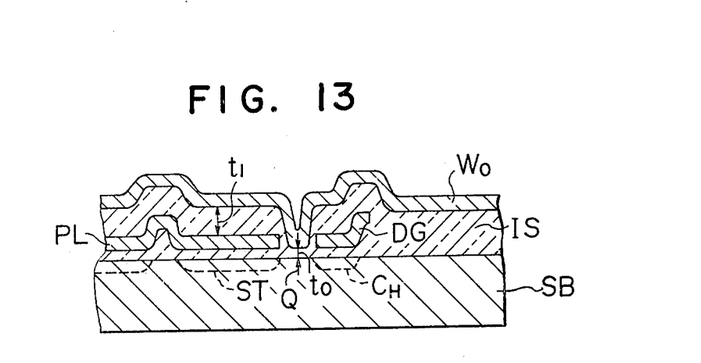
FIG. 13 is a sectional view taken along a line XIII—XIII in FIG. 12.
Figure 14:
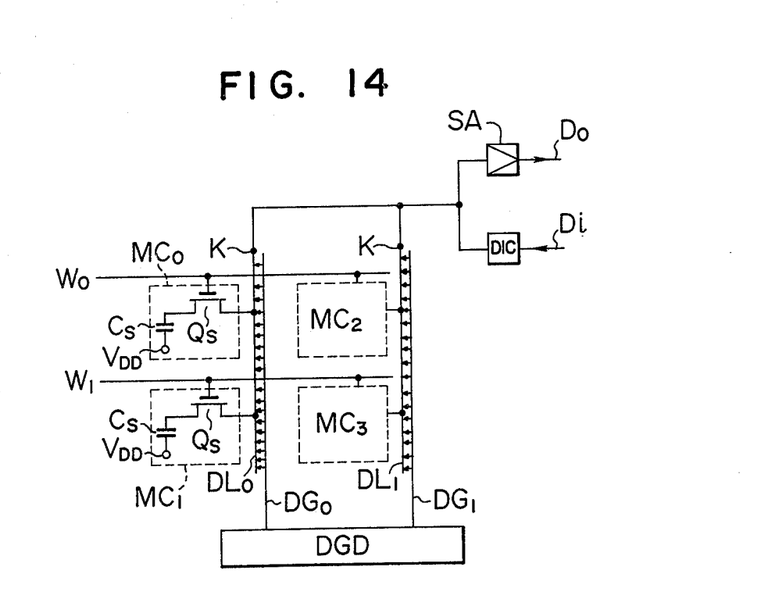
FIG. 14 shows a circuit diagram of the memory systems of FIGS. 12 and 13.

FIGS. 12 to 14 show a further embodiment of the memory system of the present invention.

FIG. 12 shows a layout of two bits of memory cells $MC_0$ and $MC_1$ and FIG. 13 shows the sectional view taken along the line XIII—XIII in FIG. 12.

As seen from the drawings, two layers of polysilicon are formed on a P-type substrate SB with an insulating film IS of $SiO_2$ being interleaved therebetween. One of the layers corresponds to the word line $W_0$ and the other corresponds to the power supply electrode PL and the data line control electrode DG.

When a high voltage is applied to the electrode PL, an inversion layer ST is formed immediately therebelow, and a storing capacitance $C_S$ is formed by a gate capacitance between the inversion layer ST and the electrode PL. When a high voltage is applied to the control electrode DG, an inversion layer CH is formed therebelow by a resulting electric field represented by arrows in FIG. 14.

In manufacturing such a memory cell, the power supply electrode PL corresponding to the power supply terminal $V_{DD}$ and the data line control electrode DG are formed on the P-type substrate with a thin oxide film being interleaved therebetween, then a thicker oxide layer having the thickness $t_1$ is formed, and only the area corresponding to the transistor $Q_S$ is etched away, and a thin oxide layer having the thickness $t_0$ is formed in the etched area, and finally the word line $W_0$ corresponding to the second layer is formed.

The operation of externally writing information into or reading information from the cell $MC_0$ thus manufactured is now explained. When the high level voltage is being applied to the control electrode DG, the inversion layer CH which forms the data line is formed immediately therebelow so that write information applied to the diffusion layer K externally of the memory array, which corresponds to the data line, is written into the capacitor $C_S$ in the cell $MC_0$ through the region Q by turning the word line $W_0$ on. Similarly, in the readout operation, the stored voltage in the cell $MC_0$ is read out to the diffusion area K by turning the word line $W_0$ on and applying the high level voltage to the control electrode DG.

The embodiment shown in FIGS. 12 and 13 has a drawback in that a charge/discharge rate for the data line is low if the cells are manufactured in a conventional process, because the inversion layer CH forming the data line and the control electrode DG can be regarded as a kind of enhancement type MOS transistor. The above drawback can be overcome by constructing them into a depletion type MOS structure. To this end, for an N-channel MOS, for example, impurity (phosphorus) may be introduced, (such as by ion implantation) into the Si surface near the boundary of the inversion layer CH and the oxide film IS. In this case, considering the fact that it is easier to form the electrodes PL and DG using the same mask, the impurity may be introduced into the inversion layers ST and CH in self-aligning manner so that the number of the masks can be reduced to compare with the process where the impurity is introduced into the inversion layer CH only. By introducing the impurity into the inversion layer ST, an S/N ratio of the memory cell is enhanced for the variation of the high voltage applied to the electrode PL because the effective storage capacitance increases, as is well known in the art. It is apparent that when the impurity is ion-implanted into the inversion layer CH, electrons moves rapidly in the inversion layer CH if the high level voltage is applied to the control electrode DG.

FIG. 14 shows a circuit diagram of the memory system constructed using the cells shown in FIGS. 12 and 13, in which four memory cells are arranged in matrix form. In FIG. 14, DGD designates a drive circuit for control lines $DG_0$ and $DG_1$, and DIC designates a data input circuit. Each of the memory cells $MC_0$ to $MC_3$ comprises a charge storing capacitor $C_S$ and a transistor $Q_S$. The charge storing capacitor $C_S$ is formed by a capacitance between the electrode PL and the inversion layer ST in FIG. 13, and the transistor $Q_S$ is formed by the inversion layers ST and CH and the region Q in FIG. 13. The power supply terminal $V_{DD}$ corresponds to the electrode PL in FIG. 13, and the data lines $DL_0$ and $DL_1$ correspond to the inversion layer CH in FIG. 13.

Assume that the stored voltages in the capacitor $C_S$ are either 0 volt (corresponding to "0") or $V_H$ (corresponding to "1") and stepwise pulse voltages changing from 0 volt to $V_H$ are applied to the word lines W ($W_0$, $W_1$) and the control lines DG ($DG_0$, $DG_1$). In such a memory system, only that memory cell in which voltages $V_H$ are applied to both of its selected lines W and DG is connected to the sense amplifier SA and the data input circuit DIC for reading and writing. When the voltage is applied to only one of the lines (e.g. when the word line $W_0$ is turned on but the control line $DG_0$ is off), no inversion layer is formed immediately below the non-selected control line DG (e.g. $DG_0$) and the data line $DL_0$ (which is formed by the formation of the inversion layer when the control line $DG_0$ is on) is isolated from the input circuit DIC and the sense amplifier SA. Thus, by selectively applying the pulses to the word lines $W_0$, $W_1$ and the control lines $DG_0$ and $DG_1$, one memory cell MC can be selected from the 2 × 2 matrix.

Figure 15:
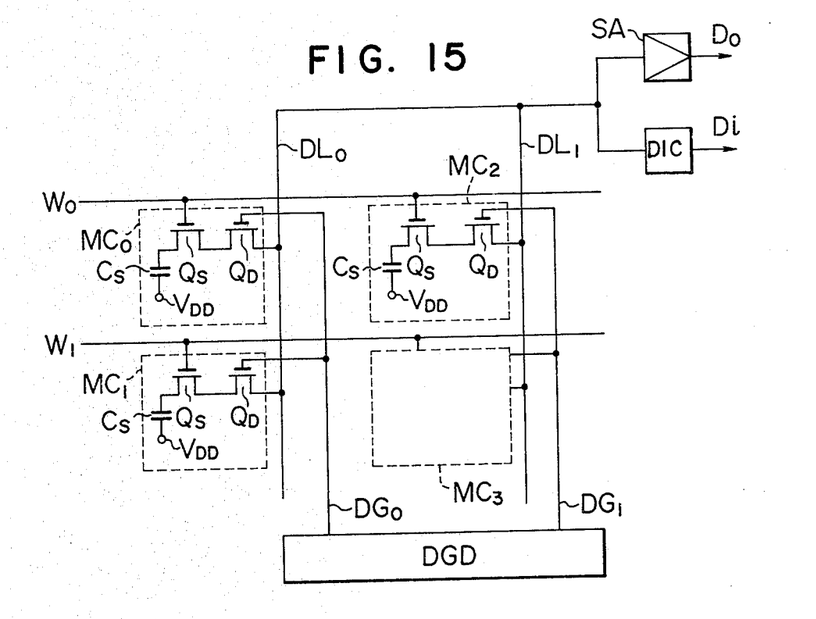
FIG. 15 shows a circuit configuration of a further embodiment of the memory system of the present invention.
Figure 16:
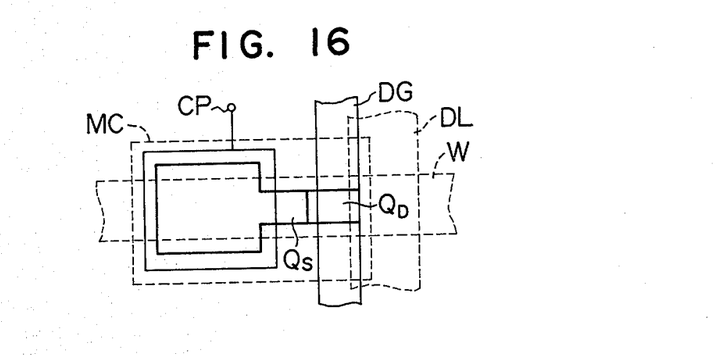
FIG. 16 shows a layout of an example of memory cell used in the memory system of FIG. 15.
Figure 17:
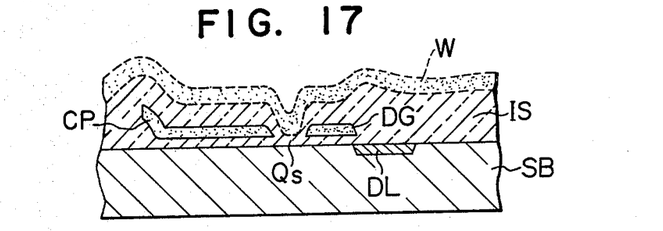
FIG. 17 shows a sectional view of FIG. 16.

FIGS. 15 to 17 show still another embodiment of the memory system of the present invention, in which FIG. 15 shows a circuit configuration, FIG. 16 shows a layout of a memory cell and FIG. 17 shows a sectional view thereof.

As shown in FIG. 15, each of the memory cells $MC_0$ to $MC_3$ comprises a transistor $Q_D$ in addition to the capacitor $C_S$ and the transistor $Q_S$ shown in FIG. 14. The transistor $Q_D$ is connected between the output electrode (drain or source) of the transistor $Q_S$ which is controlled by the word lines $W_0$ and $W_1$, and the data line DL, and it is controlled by the control lines $DG_0$ and $DG_1$. The other construction is identical to that of FIG. 14. Accordingly, the output from only that memory cell MC in which both of its word line W and the control line DG are on is taken out onto the data line DL.

The memory cells used in the circuit of FIG. 15 are constructed as shown in FIGS. 16 and 17, in which CP designates an electrode corresponding to the terminal $V_{DD}$, and DL designates a data line formed by the inversion layer, which is connected to a capacitor $C_S$ formed below the electrode CP through transistors $Q_D$ and $Q_S$ formed by the data line control electrode DG between the same and the substrate.

Figure 18:
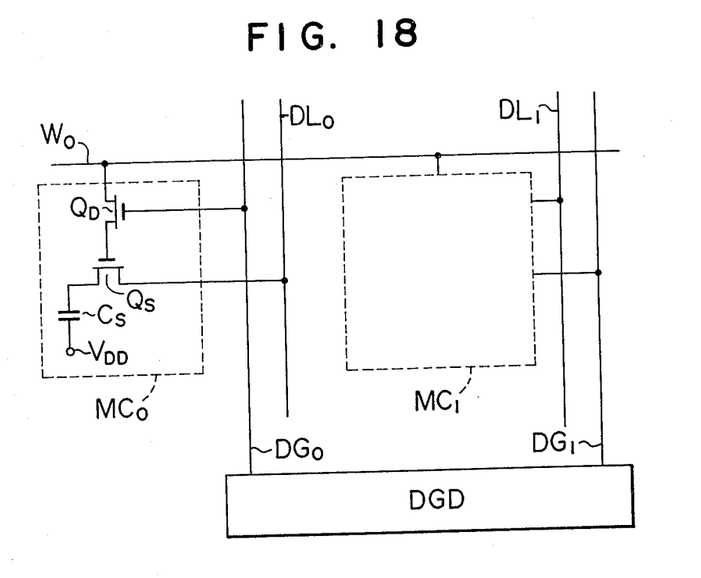
FIG. 18 is a circuit diagram of still another embodiment of the memory system of the present invention.

FIG. 18 shows a further embodiment of the memory system of the present invention, in which the transistor $Q_D$ controlled by the control line DG is connected between the gate of the transistor $Q_S$ and the word line W. When the word line $W_0$ and the control line $DG_0$ are selected, the transistors $Q_S$ and $Q_D$ in the memory cell $MC_0$ located at the intersection of the lines are turned on and the reading or writing of that cell is carried out.

Figure 19:
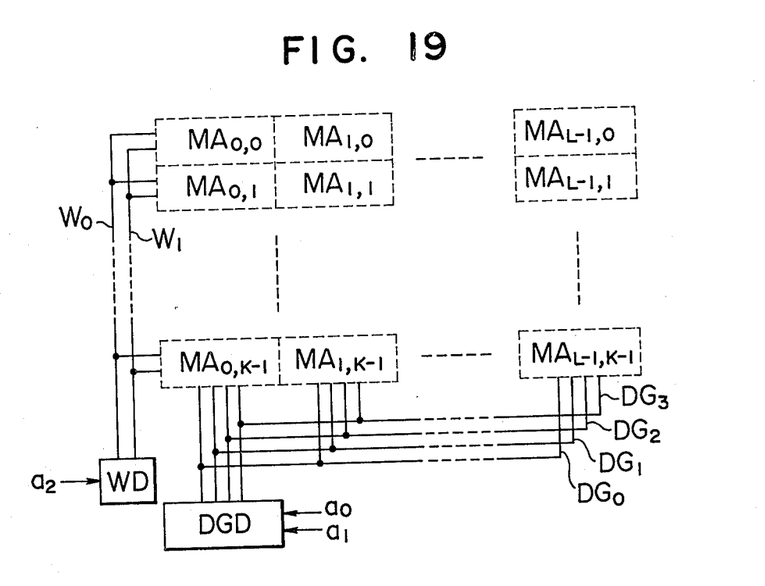
FIGS. 19 through 26 show circuit diagram of further embodiments of the memory system of the present invention.

FIG. 19 shows a still further embodiment of the memory system of the present invention, in which K × L sub-matrices $MA_{0,0}$ to $MA_{L-1,K-1}$ arranged in matrix are driven by a common control line drive circuit DGD and a common word line drive circuit WD. Each of the submatrices comprises a number of memory cells as shown in FIGS. 14, 15 and 18, for example, arranged in matrix. The word lines $W_0$ and $W_1$, and the control lines $DG_0$ to $DG_3$ are arranged commonly to each of the matrices MA. Pulses are applied selectively to the word lines $W_0$ and $W_1$ by the word line drive circuit WD and the address signal $a_2$. Similarly, a pulse is selectively applied to one of the control lines $DG_0$ to $DG_3$ by the control line drive circuit DGD and the address signals $a_0$ and $a_1$. As a result, a signal is read out of one selected memory cell in each of the matrices MA into the sense amplifier in each of the matrices MA. The output signals from the respective sense amplifiers are further selected so that only one of them is read out of the chip. An important feature in FIG. 19 is that the respective matrices MA are interconnected via mere wiring and drive circuits WD, DGD for driving the matrices can be arranged centrally. In the prior art semiconductor memory, each of the word lines or address lines in each of the memory matrices is coupled with the address decoder and the drive circuit, which occupy considerably larger area than the memory cell. Therefore, a pitch for the memory cells does not match to a pitch for those circuits. This significantly impedes the realization of a high density integration. On the other hand, in the arrangement of FIG. 19, since the wiring (a pitch of which can be smaller than the pitch for the memory cells) is the only limitation factor, the impediment to the realization of the high density integration is substantially eliminated.

Figure 20:
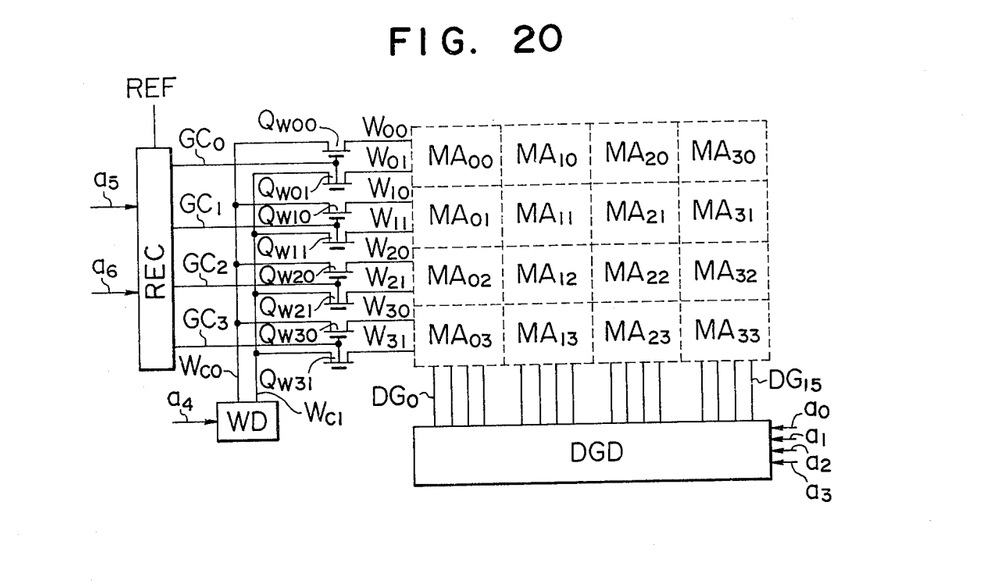

FIG. 20 shows another embodiment of the memory system of the present invention, in which memory cells having small pitch coordinates are used. (In the illustrated embodiment, the word line coordinate has a small pitch and the data line coordinate has a sufficiently large pitch). While the arrangement of FIG. 19 produces one readout signal from each of the matrices MA, the arrangement of FIG. 20 produces one readout signal from a group of matrices MA.

In FIG. 20, REC designates a refresh control circuit, $GC_0$ to $GC_3$ designate control signal lines from the refresh control circuit REC, $Q_{W00}$ to $Q_{W31}$ designate transistors, $DG_0$ to $DG_{15}$ designate control lines, $W_{00}$ to $W_{31}$ designate word lines, and $MA_{00}$ to $MA_{33}$ designate sub-matrices.

Initially, all of the transistors $Q_{W00}$ to $Q_{W31}$ are turned on by the signals on the control signal lines $GC_0$ to $GC_3$ from the control circuit REC and the signals on the signal lines $W_{C0}$ and $W_{C1}$ from the word drive circuit WD, to precharge all of the word lines $W_{00}$ to $W_{31}$ to the high level voltage. At this time, the control lines $DG_0$ to $DG_{15}$ are kept at 0 volt. Then the non-selected one of the signal lines $W_{C0}$ and $W_{C1}$ is discharged to 0 volt by the address signal $a_4$ and the word line drive circuit WD. In this manner, the non-selected word lines in the respective sub-matrices are discharged to 0 volt. Subsequently, only one selected line of the control signal lines $GC_0$ to $GC_2$ is reset to 0 volt by the control circuit REC and the address signals $a_5$ and $a_6$, and the remaining non-selected lines are kept at the high level voltage. After the completion of the above operation, a high level voltage pulse is applied to selected one (e.g. $DG_0$) of the control lines $DG_0$ to $DG_{15}$ by the circuit DGD and the address signals $a_0$ to $a_3$. Thus, only that memory cell MC which is located at the intersection of the word line $W_{00}$ and the control line $DG_0$ can be selected. A feature of the present embodiment, in comparison with the embodiment of FIG. 19, is as follows. Generally, when one memory cell is to be selected from each of the matrices MA, the sense amplifier associated with each of the matrices MA should be operated because of destructive readout. In general, when the sense amplifiers are operated, the power consumption increases. If a number of sense amplifiers operate simultaneously, an allowable power consumption level for the LSI memory will be exceeded. Accordingly, the power consumption of other supporting circuit should be minimized. Considering the fact that the product of power consumption and speed is generally constant, it means the reduction in speed. In the embodiment of FIG. 20, only one sense amplifier SA is operated and hence high operating speed is assured. In a prior art memory system in which all of the memory cells connected to one word line are destructively read out simultaneously, such as a so-called one-transistor cell comprising a transistor and a storting capacitor, it is not possible to select only one of the memory cells and to selectively operate one sense amplifier, and therefore the system has low operating speed. This is apparent from the essential drawback of the one-transistor cell in which re-write operation is essential, as described above. The embodiment of FIG. 20 can be realized owing to the fact that the memory cells themselves operate in voltage coincidence mode like the embodiment of FIG. 14. The memory cell shown in FIG. 14 is a dynamic memory cell which requires periodic rewrite (refresh). In this case, it is more effective to refresh a plurality of memory cells MC simultaneously. In the embodiment of FIG. 20, the refresh operation is carried out in the following manner. When a refresh instruction signal REF is active, the signal lines $GC_0$ to $GC_3$ are reset to 0 volt after either one of the signal lines $W_{C0}$ and $W_{C1}$ (e.g. $W_{C1}$) has been discharged. As a result, the transistors $Q_{W00}$ to $Q_{3W31}$ are cut off and the word lines $W_{00}$, $W_{10}$, $W_{20}$ and $W_{30}$ which have been connected to the signal line $W_{C0}$ are maintained at the high level voltage. Thereafter, the control line $DG_0$ is turned on so that four memory cells located at the intersections of four word lines and the control line $DG_0$ are selected and the sense amplifiers SA in the matrix to which the selected memory cells belong is activated to perform the refresh operation. It is apparent that if the wiring pitch of the word lines $W_{00}$ to $W_{31}$ is sufficiently large, a decoder and a drive circuit may be connected to each of the word lines like the prior art system in order to enable the application of a voltage to selected one of the word lines.

Figure 21:
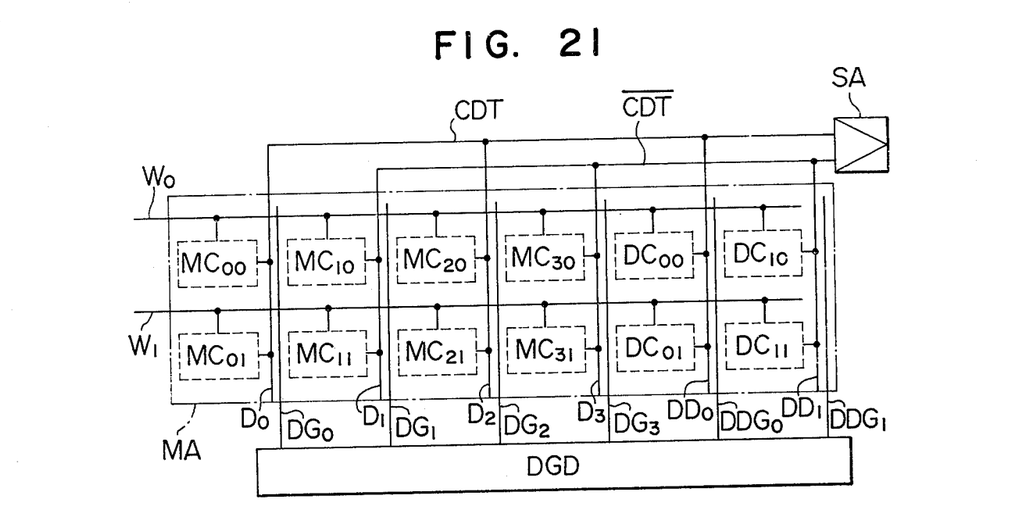

FIG. 21 shows another embodiment of the memory system of the present invention, in which dummy cells DC for cancelling noises which occur during the application of voltages to the word lines W are provided for differentially sensing the signal from the selected memory cell MC. When a memory cell MC connected to even-numbered control lines DG ($DG_0$, $DG_2$) is to be selected, the dummy control line $DDG_1$ is turned on, and when a memory cell MC connected to odd-numbered control lines DG ($DG_1$, $DG_30$ is to be selected, the dummy control line $DDG_0$ is turned on. A feature of the present embodiment resides in that the memory cell MC to be selected and the dummy cell DC are connected to the same word line whereby the noise can be readily cancelled out and the word line drive circuit can be simplified. $\overline{CDT}$ designates a common data line which connects the data line $D_0$, $D_2$ and $DD_0$ in common, and CDT designates a common data line which connects the data lines $D_1$, $D_3$ and $DD_1$ in common.

Figure 22:
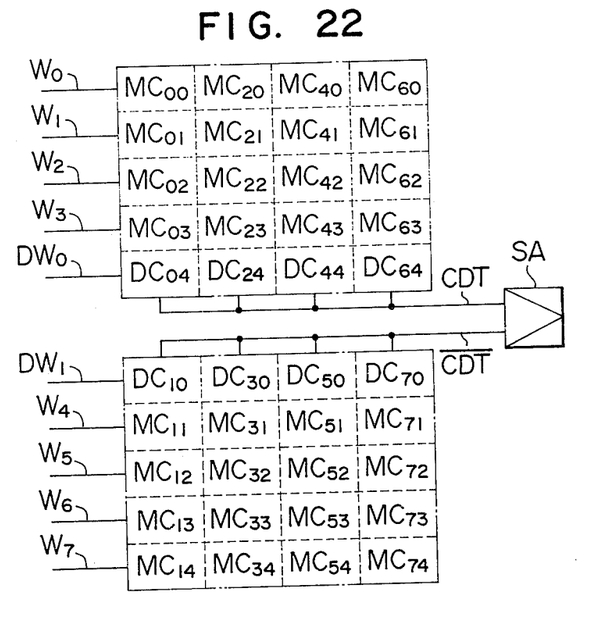

FIG. 22 shows another embodiment of the memory system of the present invention. In this embodiment, when a memory array MC in the memory array to which the word lines $W_0$ to $W_3$ belong is to be selected, the dummy word line $DW_1$ in the memory array to which other word lines $W_4$ to $W_7$ belong is turned on. On the other hand, when a memory cell MC in the memory array to which the word lines $W_4$ to $W_7$ belong is to be selected, the dummy word line $DW_0$ in the memory array to which other word lines $W_0$ to $W_3$ belong is turned on, and signals which appear on the common data lines CDT and $\overline{CDT}$ in differential manner are sensed by the sense amplifier SA.

Figure 23:
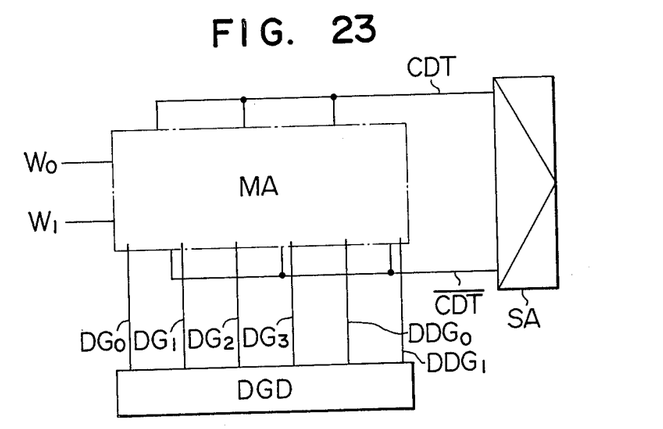

FIG. 23 shows another embodimnt of the memory system of the present invention, in which the common data lines CDT and $\overline{CDT}$ are taken from opposite sides of the matrix MA as shown in FIG. 21.

Figure 24:
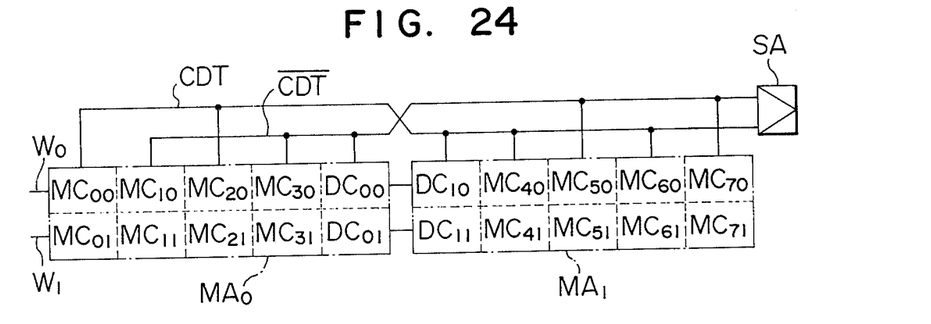
Figure 25:
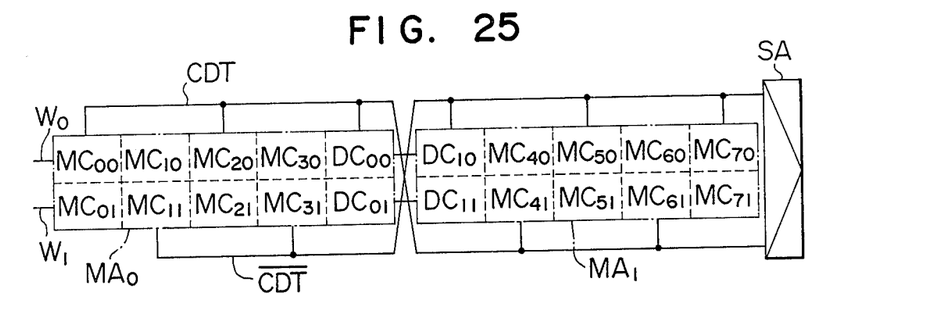

Generally, because the readout signal voltage from the memory cell MC as shown in FIGS. 12 and 13 are very small, care must be paid during the manufacturing process to prevent electrical unbalance (e.g. capacitive unbalance) between the data lines CDT and $\overline{CDT}$ due to the misalignment of mask during the manufacturing process. For example, if the capacitance of the data line CDT is much larger than that of the data line $\overline{CDT}$ in FIGS. 21 and 23, due to the mask misalignment, this capacitive unbalance equivalently produces a noise which will prevent correct detection of the signal. This inconvenience can be eliminated by intersecting the data lines CDT and $\overline{CDT}$ with each other odd times to completely balance the capacitanced, the intersection being such as shown in FIGS. 24 and 25. While a single intersection is illustrated, it should be understood that this is not restrictive.

Figure 26:
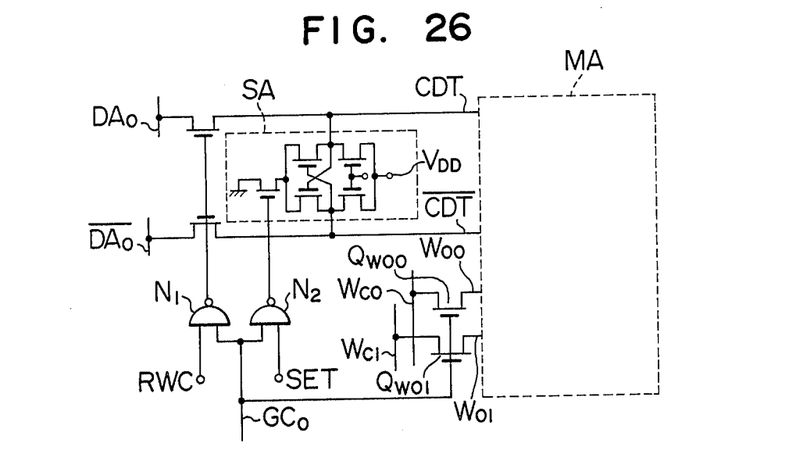

FIG. 26 shows a portion of a particular arrangement in which the arrangement of FIG. 20 is used together with the dummy cells of FIG. 21. N1 and N2 designate NAND gates, RWC and $\overline{SET}$ designate control signal terminals, and $DA_0$, $\overline{DA_0}$ designate data output lines. The sense amplifier SA may be a known flip-flop circuit.

As described above, when the signal line $GC_0$ in FIG. 20 is selected and reset to 0 volt and only the word line $W_{00}$ is held at the high level voltage and thereafter the control line $DG_0$ is turned on (the dummy cells are omitted in FIG. 20), the readout signals from the memory cell MC appears on the common data CDT and $\overline{CDT}$. When the set signal $\overline{SET}$ is subsequently turned on, the readout signals are amplifier by the flip-flop type sense amplifier SA. Thereafter the control signal RWC is turned on to produce outputs on the output lines $DA_0$ and $\overline{DA_0}$. If both of the word lines $W_{00}$ and $W_{01}$ are not selected, the signal line $GC_0$ remains at the high level voltage so that the sense amplifier SA does not operate even when the set signal $\overline{SET}$ is turned on. The common data lines CDT and $\overline{CDT}$ are disconnected from the data output lines $DA_0$ and $\overline{DA_0}$ even when the control signal RWC is turned on.

As described hereinabove, the present invention enables the realization of a high speed, high density LSI memory.

I claim:

1. A memory system comprising a plurality of word lines arranged in parallel in a predetermined direction and to which signals are selectively applied, a plurality of information lines arranged in parallel to traverse said word lines, a plurality of memory cells connected at the intersections of said word lines and said information lines, a plurality of control lines arranged in parallel and disposed adjacently to respective information lines to provide field interaction therewith and to which signals are selectively applied for reading out on the corresponding information line only the information stored in a selected memory cell arranged at the intersection of a selected control line and a word line to which signals are applied, and a sense amplifier having at least one input terminal to which said information lines are connected in common.

2. A memory system according to claim 1 wherein each of said memory cells comprises a transistor and a capacitor, the input electrode of said transistor being connected to one of said word lines, the first output electrode of said transistor being connected to one of information lines, the second output electrode of said transistor being connected to one terminal of said capacitor, and the other terminal of said capacitor being connected to one of said control lines.

3. A memory system according to claim 1 wherein said memory cells include dummy cells one for each of the information lines, and further including at least one sense amplifier for differentially amplifying outputs of pairs of information lines.

4. A memory system according to claim 1 wherein each of said information lines is rendered effective when a given signal is applied to the corresponding control line.

5. A memory system according to claim 4 wherein each of said memory cells comprises a transistor, a capacitor and a power supply terminal, the input electrode of said transistor being connected to one of said word lines, the first output electrode of said transistor being connected to one of said information lines, the second output electrode of said transistor being connected to one terminal of said capacitor, and the other terminal of said capacitor being connected to said power supply terminal.

6. A memory system according to claim 1 wherein each of said memory cells comprises first and second transistors, a capacitor and a power supply terminal, an input electrode of said first transistor being connected to one of said control lines, a first output electrode of said first transistor being connected to one of said information lines, a second output electrode of said first transistor being connected to a first output electrode of said second transistor, an input electrode of said second transistor being connected to one of said word lines, a second output electrode of said second transistor being connected to one terminal of said capacitor, and the other terminal of said capacitor being connected to said power supply terminal.

7. A memory system according to claim 1 wherein each of said memory cells comprises first and second transistors, a capacitor and a power supply terminal, the input electrode and the first output electrode of said first transistor being connected to one of said control lines and one of said word lines, respectively, the input electrode and the first output electrode of said second transistor being connected to the second output electrode of said first transistor and one of said information lines, respectively, and one and the other terminals of said capacitor being connected to a second output terminal of said second transistor and said power supply terminal, respectively.

* * * * *